United States Patent
Fang et al.

(10) Patent No.: US 7,888,190 B2
(45) Date of Patent: Feb. 15, 2011

(54) SWITCHING DEVICE FOR A PIXEL ELECTRODE AND METHODS FOR FABRICATING THE SAME

(75) Inventors: Kuo-Lung Fang, HsinChu County (TW); Wen-Ching Tsai, Yilan County (TW); Yeong-Shyang Lee, Hsinchu (TW); Han-Tu Lin, Taichung County (TW)

(73) Assignee: Au Optronics Corp., Hsinchu (TW)

( * ) Notice: Subject to any disclaimer, the term of this patent is extended or adjusted under 35 U.S.C. 154(b) by 442 days.

(21) Appl. No.: 12/170,620

(22) Filed: Jul. 10, 2008

(65) Prior Publication Data

US 2008/0268586 A1    Oct. 30, 2008

Related U.S. Application Data

(62) Division of application No. 11/247,510, filed on Oct. 11, 2005, now Pat. No. 7,411,212.

(30) Foreign Application Priority Data

Jun. 13, 2005    (TW) .............................. 94119478 A (51) Int. Cl.
*H01L 21/00* (2006.01)

(52) U.S. Cl. ...................... 438/151; 438/158; 438/653; 438/655; 257/E21.561

(58) Field of Classification Search ................ 438/151, 438/158, 653, 655; 257/E21.561
See application file for complete search history.

(56) References Cited

U.S. PATENT DOCUMENTS

| | | | |
|---|---|---|---|
| 6,660,634 B1 | 12/2003 | Ngo et al. | |
| 6,844,258 B1 | 1/2005 | Fair et al. | |
| 7,332,383 B2 * | 2/2008 | Fang et al. | ................... 438/149 |

FOREIGN PATENT DOCUMENTS

| | | |
|---|---|---|
| CN | 1622298 | 6/2005 |
| JP | 2000332015 | 11/2000 |

* cited by examiner

*Primary Examiner*—Jack Chen
(74) *Attorney, Agent, or Firm*—Thomas, Kayden, Horstemeyer & Risley (57) ABSTRACT

The invention discloses a switching element of a pixel electrode for a display device and methods for fabricating the same. A gate is formed on a substrate. A first copper silicide layer is formed on the gate. An insulating layer is formed on the first copper silicide layer. A semiconductor layer is formed on the insulating layer. A source and a drain are formed on the semiconductor layer. Moreover, a second copper silicide layer is sandwiched between the semiconductor layer and the source/drain.

14 Claims, 8 Drawing Sheets

SWITCHING DEVICE FOR A PIXEL ELECTRODE AND METHODS FOR FABRICATING THE SAME

CROSS REFERENCE TO RELATED APPLICATIONS

This application is a Divisional of pending U.S. patent application Ser. No. 11/247,510, filed Oct. 11, 2005 and entitled "SWITCHING DEVICE FOR A PIXEL ELECTRODE AND METHODS FOR FABRICATING THE SAME," the contents of which are incorporated by reference herein.

BACKGROUND

The invention relates to a display device, and more particularly to a switching device for a pixel electrode and methods for fabricating the same.

Figure 1:
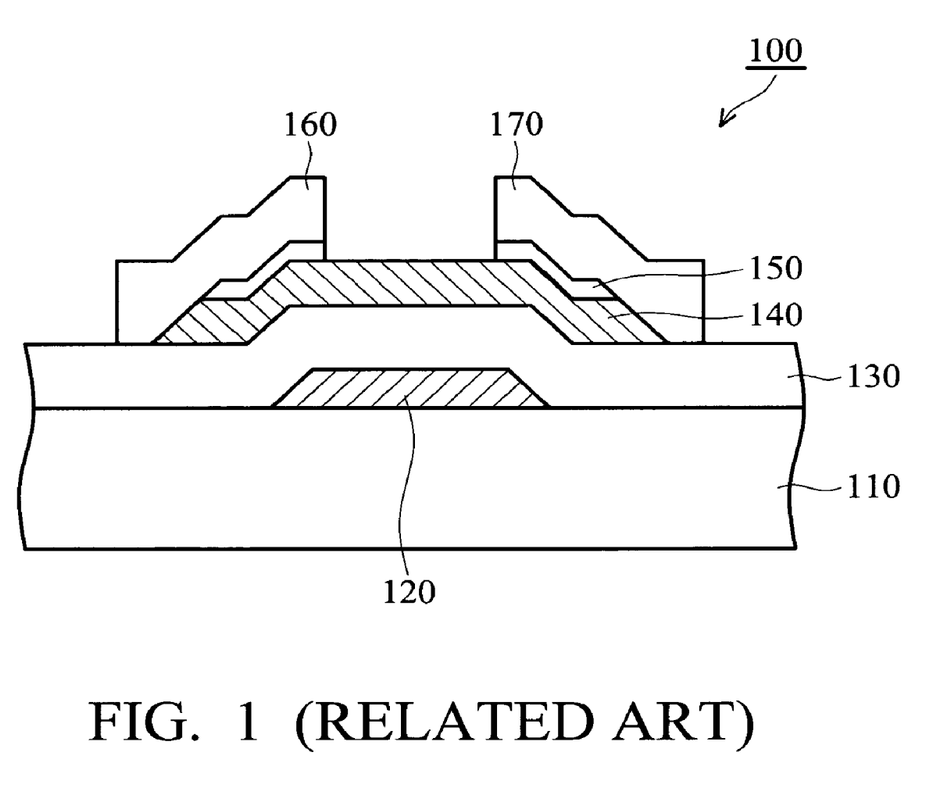
FIG. 1 is a sectional view of a conventional TFT structure.

Bottom-gate type thin film transistors (TFTs) are widely used for thin film transistor liquid crystal displays (TFT-LCDs). FIG. 1 is a sectional view of a conventional bottom-gate type TFT structure 100. The TFT structure 100 typically comprises a glass substrate 110, a gate 120, a gate-insulating layer 130, a channel layer 140, an ohmic contact layer 150, a source 160 and a drain 170.

As the size of TFT-LCD panels increases, metals having low resistance are required. For example, gate lines employ low resistance metals such as Cu and Cu alloy in order to improve operation of the TFT-LCD.

However, Cu can react with radicals to form Cu oxide in subsequent processes, thereby increasing resistance. Also, Cu diffuses easily and reacts with silicon to form $CuSi_x$, significantly affecting reliability of the device.

JP 2000-332015, the entirety of which is hereby incorporated by reference, discloses a method of forming $CuSi_x$. A layer of $CuSi_x$ is formed between a silicon-rich nitride layer and a Cu layer, enhancing adhesion therebetween.

SUMMARY

Thin film transistors and fabrication methods thereof are provided. Diffusion of Cu is reduced, and no extra processes such as photolithography are required.

An embodiment of a fabrication method comprises forming a gate on a substrate. A first $CuSi_x$ layer is formed on the gate by plasma treatment on the gate in a silane-containing chamber. The temperature of the chamber is substantially about 180° C. to 370° C.

To enhance the barrier properties of the first $CuSi_x$ layer, a subsequent plasma treatment is performed on the first $CuSi_x$ layer in a chamber containing $N_2$ and $NH_3$. The temperature of the chamber is substantially about 180° C. to 370° C.

An insulating layer is formed on the first $CuSi_x$ layer. A semiconductor layer is formed on the insulating layer. A source and a drain are formed on the semiconductor layer. A pixel electrode is formed, electrically connecting to the source or the drain.

Another embodiment of a method comprises forming a second $CuSi_x$ layer between the semiconductor layer and the source/drain.

Formation of the second $CuSi_x$ layer comprises forming a Cu layer or a Cu alloy layer on the semiconductor layer and performing a plasma treatment on the Cu layer or the Cu alloy layer in a silane-containing chamber. The temperature of the chamber is substantially about 180° C. to 370° C.

To enhance the barrier properties of the second $CuSi_x$ layer, a subsequent plasma treatment is performed on the second $CuSi_x$ layer in a chamber containing $N_2$ and $NH_3$. The temperature of the chamber is substantially about 180° C. to 370° C.

In these embodiments, the first $CuSi_x$ layer is conformally formed on the gate. The substrate comprises a glass substrate. The insulating layer comprises a silicon oxide, silicon nitride, silicon oxynitride, tantalum oxide or aluminum oxide layer. The semiconductor layer comprises silicon. The source/drain comprises Cu or Cu alloy.

Thin film transistors (TFTs) of the invention can be bottom-gate or top-gate, serving as a switching device for a pixel electrode when the source/drain are electrically in contact with a pixel electrode. In addition, the TFTs of the invention can be applied in display such as LCD.

DESCRIPTION OF THE DRAWINGS

The invention can be more fully understood by reading the subsequent detailed description in conjunction with the examples and references made to the accompanying drawings.

DETAILED DESCRIPTION

First Embodiment

An exemplary process for fabricating a first embodiment of TFTs of the invention is shown in FIGS. 2A-2F.

Figure 2A:
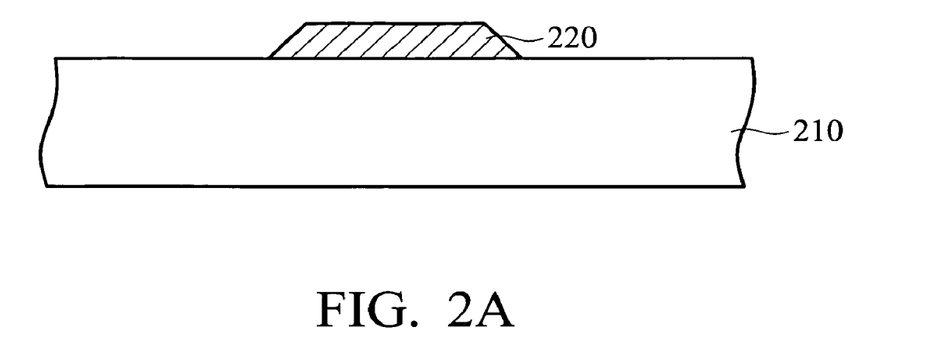
FIGS. 2A to 2F are sectional views of an exemplary process for fabricating a first embodiment of a TFT structure of the present invention.

In FIG. 2A, a Cu layer (not shown) is formed on a substrate 210, for example, by chemical vapor deposition (CVD), electrochemical plating (ECP), or physical vapor deposition (PVD). The Cu layer is deposited, forming a gate 220 on the substrate 210. The substrate 210 may be a glass substrate. The gate 220 may be copper with thickness substantially about 100 nm to 500 nm.

Figure 2B:
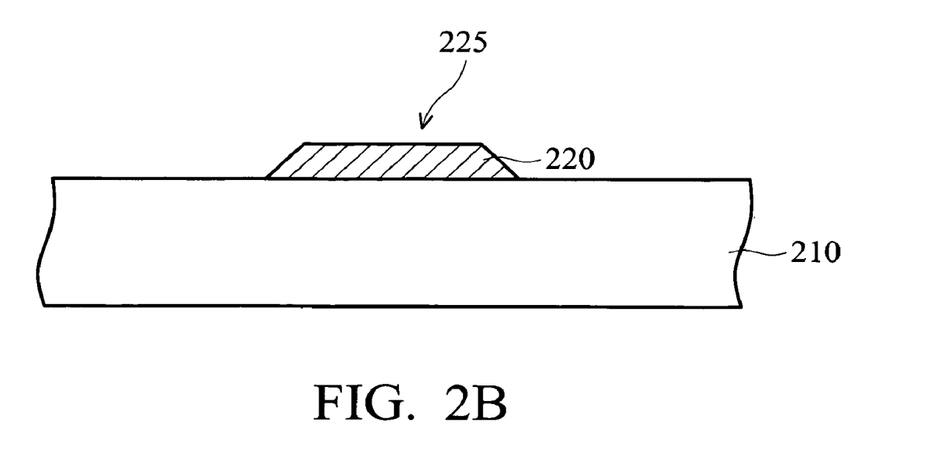
Figure 2C:
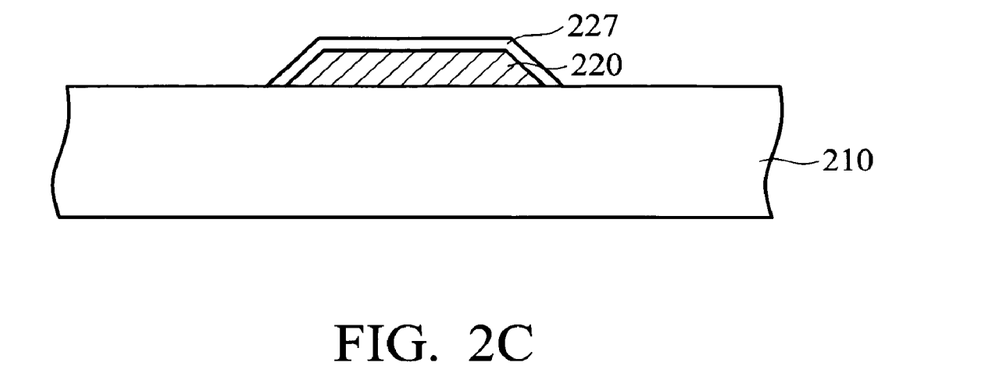

In FIGS. 2B and 2C, a first $CuSi_x$ layer 227 is conformally formed on the gate 220 by plasma treatment 225 of the gate 220 in a silane-containing chamber. The temperature of the chamber is substantially about 180□ to 370□. Silicon atoms react with the surface of the gate 220 of Cu, forming the first $CuSi_x$ layer 227, preventing Cu from diffusing to the insulating layer 230 shown in FIG. 2E. The thickness of the first $CuSi_x$ layer 227 is substantially about 5 nm to 100 nm.

Figure 2D:
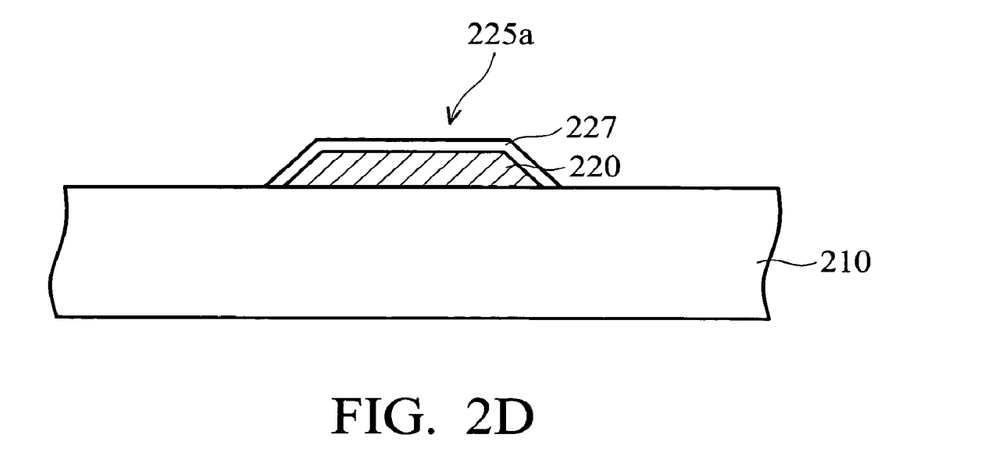

In FIG. 2D, a subsequent plasma treatment 225a is performed on the first $CuSi_x$ layer 227 in a chamber containing $N_2$ and $NH_3$. The temperature of the chamber is substantially about 180° C. to 370° C. Nitrogen atom reacts with the surface of the first $CuSi_x$ layer 227 to form N—Si bond, thereby enhancing the barrier properties of the first $CuSi_x$ layer.

Figure 2E:
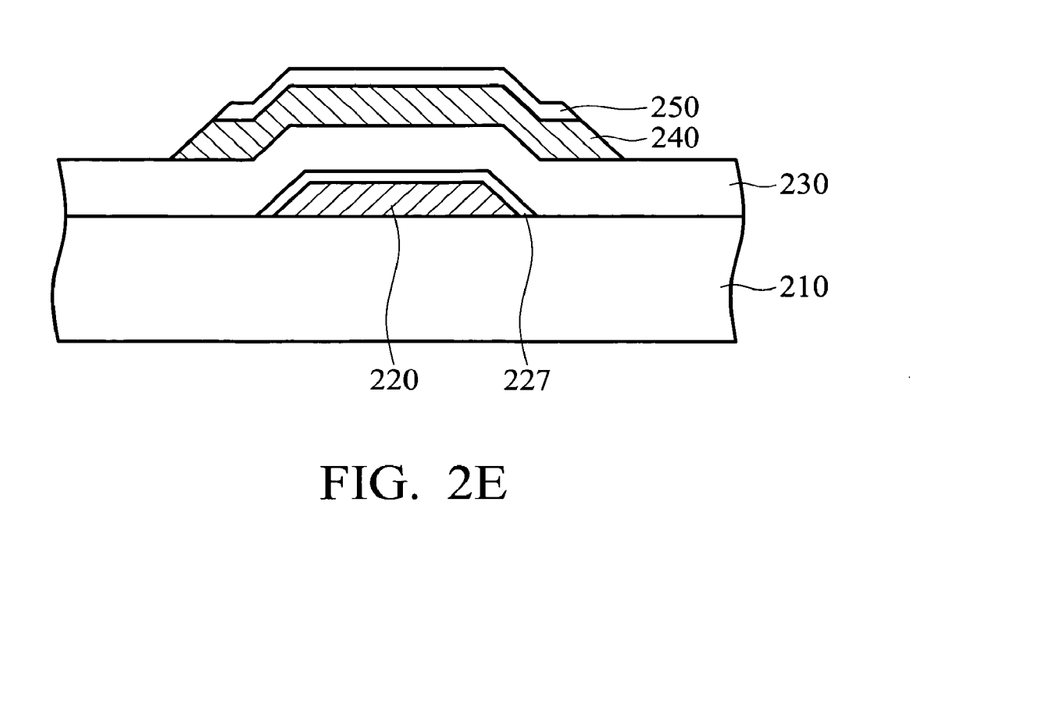

In FIG. 2E, an insulating layer 230 is formed on the first $CuSi_x$ layer 227. A semiconductor layer (not shown) is formed on the insulating layer 230. The insulating layer 230 comprises silicon oxide, silicon nitride, silicon oxynitride, tantalum oxide or aluminum oxide. The semiconductor layer comprising a channel layer 240 and an ohmic contact layer 250 is defined on a portion of the gate-insulating layer 230 by deposition and patterning. The channel layer 240 can be an undoped amorphous silicon layer formed by CVD. The ohmic contact layer 250 can be an impurity-added silicon layer formed by CVD. The impurity can be n type dopant (for example, P or As) or p type dopant (for example, B).

Figure 2F:
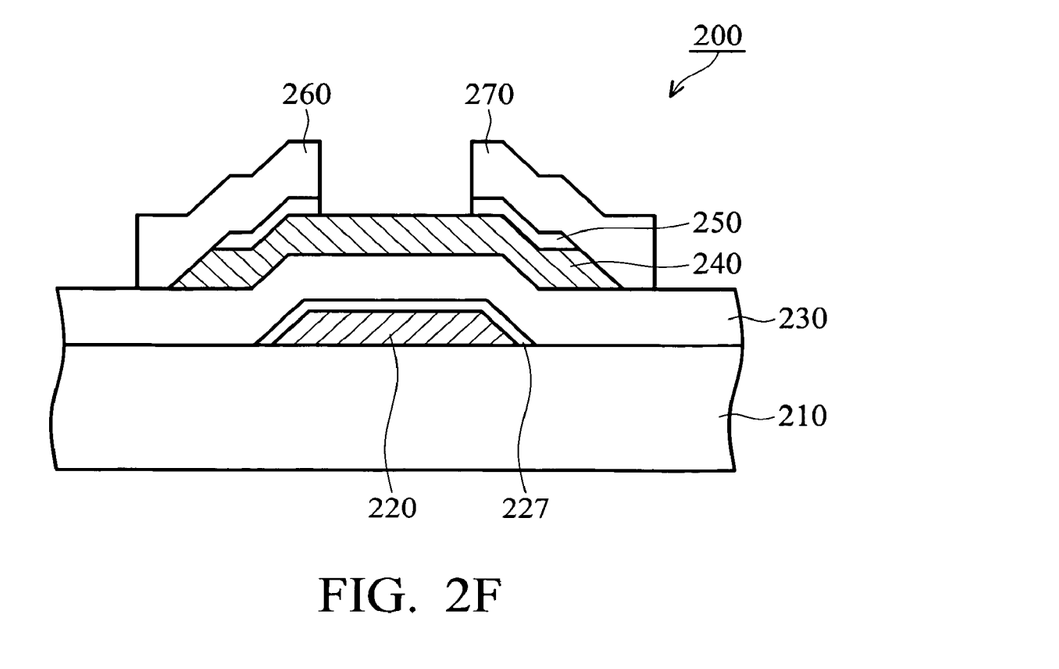

In FIG. 2F, a Cu layer (not shown) is formed on the ohmic contact layer 250, for example, by CVD, ECP, or PVD. The source/drain 260/270, of Cu or Cu alloy, are formed on the ohmic contact layer 250 by selectively etching through the Cu layer, the ohmic contact layer 250, exposing a portion of the surface of the channel layer 240. A pixel electrode is formed, electrically connected to the source/drain 260/270. A resultant thin film transistor 200 is obtained.

Second Embodiment

An exemplary process for fabricating a second embodiment of TFTs of the present invention is shown in FIGS. 3A-3H.

Figure 3A:
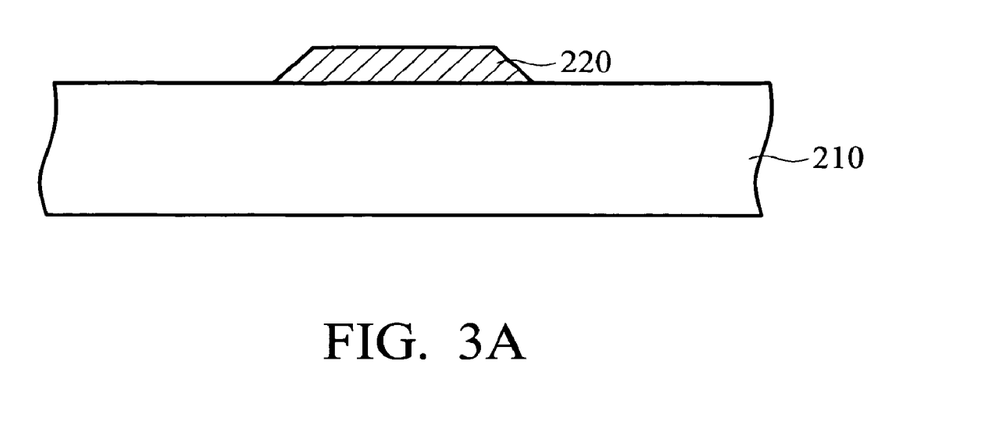
FIGS. 3A to 3H are sectional views of an exemplary process for fabricating a second embodiment of a TFT structure of the present invention.

In FIG. 3A, a Cu layer (not shown) is formed on a substrate 210, for example, by chemical vapor deposition (CVD), electrochemical plating (ECP), or physical vapor deposition (PVD). The Cu layer is etched, forming a gate 220 on the substrate 210. The substrate 210 may be a glass substrate. The gate 220 may be copper with thickness substantially about 100 nm to 500 nm.

Figure 3B:
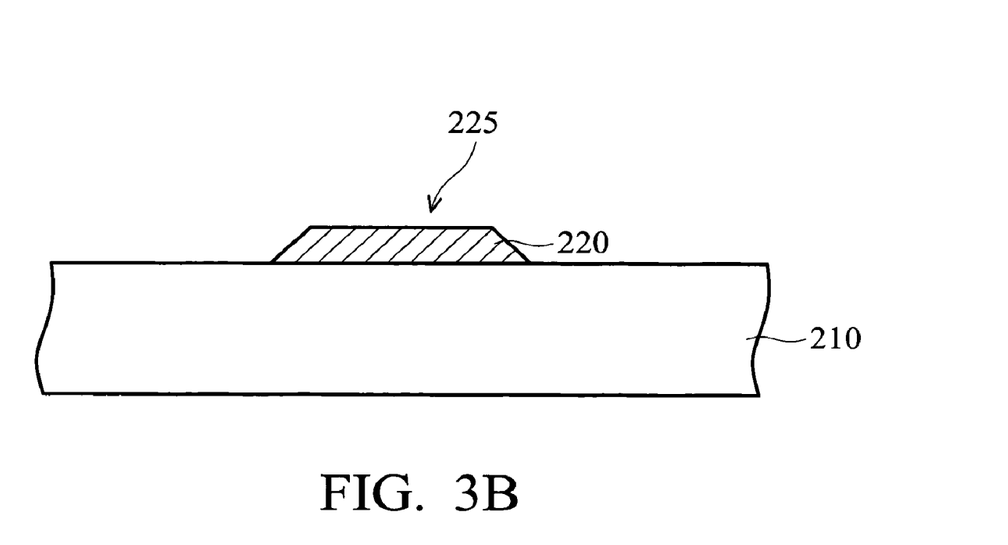
Figure 3C:
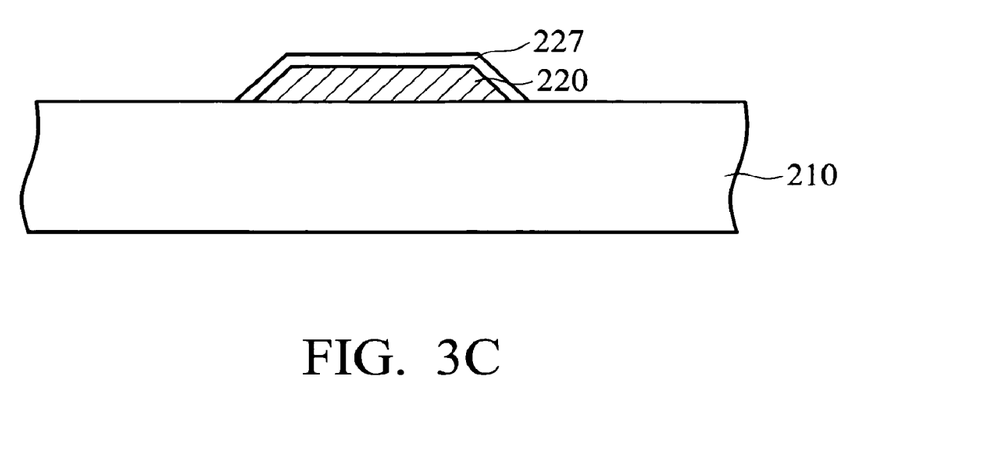

In FIGS. 3B and 3C, a first $CuSi_x$ layer 227 is conformally formed on the gate 220 by performing plasma treatment 225 of the gate 220 in a silane-containing chamber. The temperature of the chamber is substantially about 180° C. to 370° C. Silicon atoms react with the surface of the gate 220 of Cu, forming the first $CuSi_x$ layer 227, preventing Cu from diffusing to the insulating layer 230 shown in FIG. 3E. The thickness of the first $CuSi_x$ layer 227 is substantially about 5 nm to 100 nm.

Figure 3D:
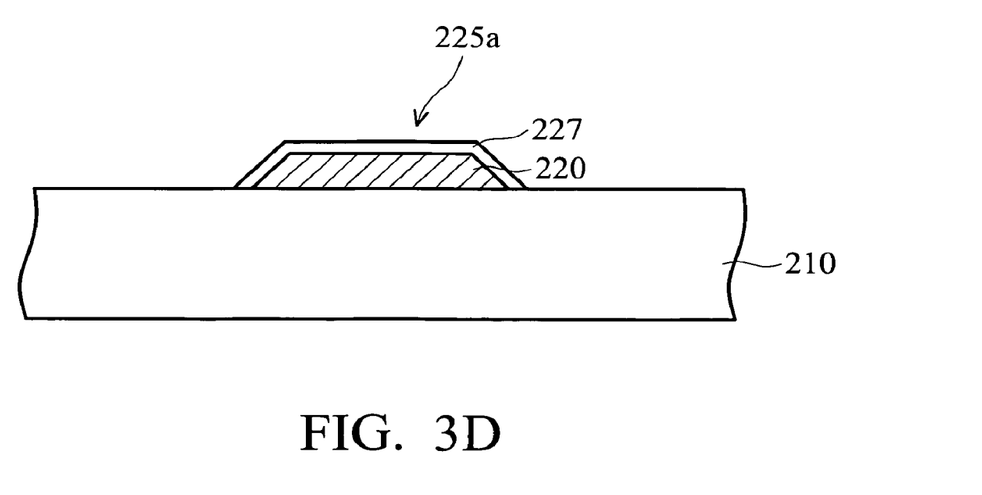

In FIG. 3D, a subsequent plasma treatment 225a is performed on the first $CuSi_x$ layer 227 in a chamber containing $N_2$ and $NH_3$. The temperature of the chamber is substantially about 180° C. to 370° C. Nitrogen atom reacts with the surface of the first $CuSi_x$ layer 227 to form N—Si bond, thereby enhancing the barrier properties of the first $CuSi_x$ layer.

Figure 3E:
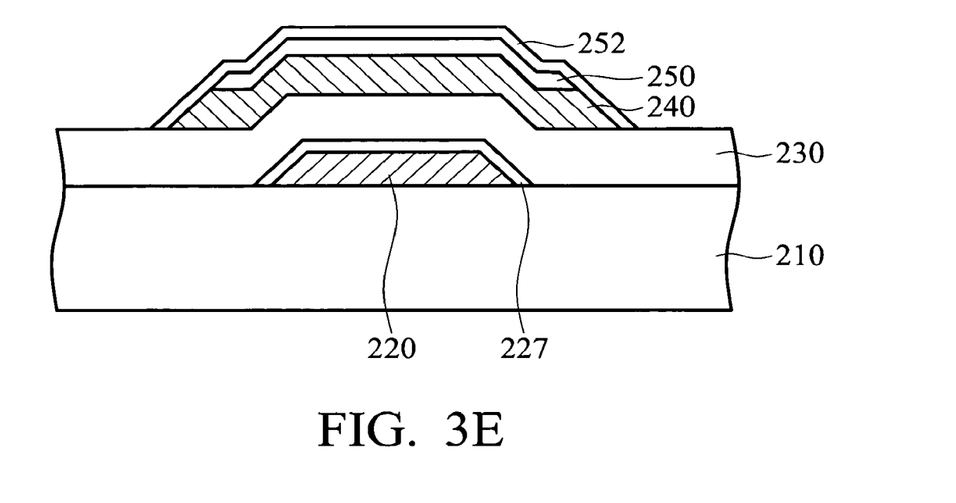

In FIG. 3E, an insulating layer 230 is formed on the first $CuSi_x$ layer 227. A semiconductor layer (not shown) is formed on the insulating layer 230. The insulating layer 230 comprises silicon oxide, silicon nitride, silicon oxynitride, tantalum oxide or aluminum oxide. The semiconductor layer comprising a channel layer 240 and an ohmic contact layer 250 is defined on a portion of the gate-insulating layer 230 by deposition and patterning. The channel layer 240 can be an undoped amorphous silicon layer formed by CVD. The ohmic contact layer 250 can be an impurity-added silicon layer formed by CVD. The impurity can be n type dopant (for example P or As) or p type dopant (for example B).

In FIG. 3E, a Cu layer 252 is formed on the ohmic contact layer 250, for example, by CVD, ECP, or PVD.

Figure 3F:
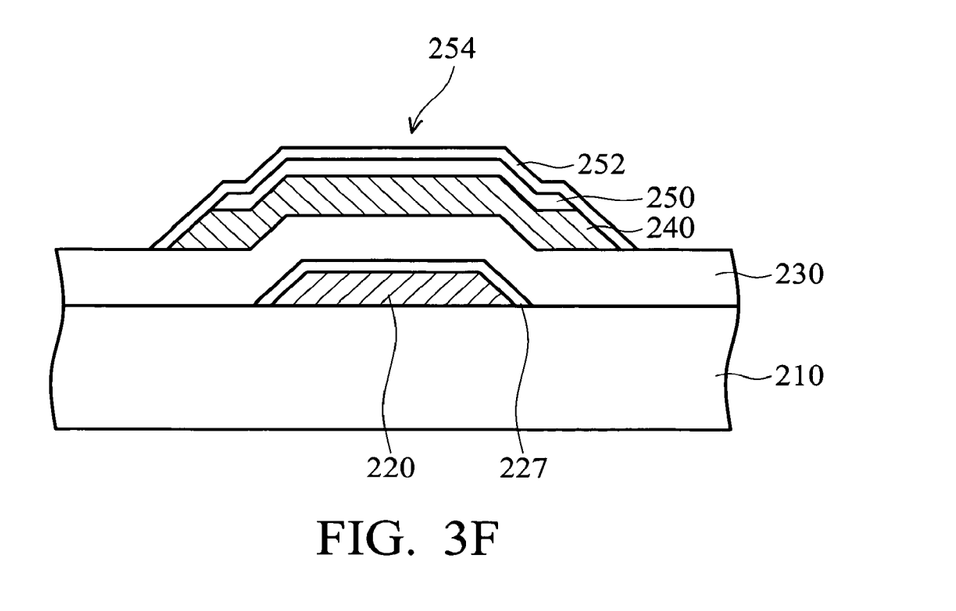
Figure 3G:
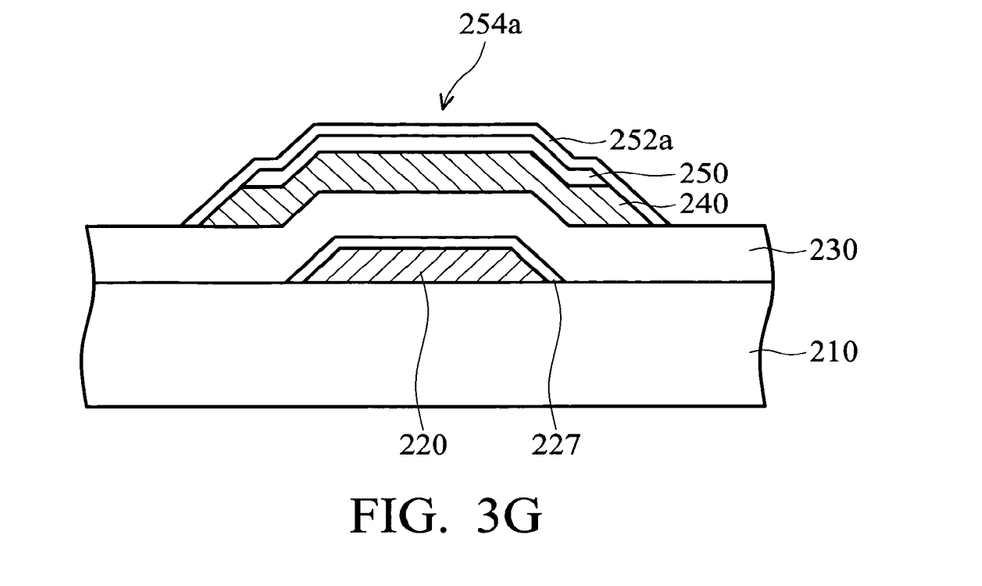

In FIGS. 3F and 3G, a Cu layer 252 is formed on the semiconductor layer. In other embodiments, a Cu alloy layer can be formed in place of the Cu layer. Plasma treatment is performed on the Cu layer 252, completely forming a second $CuSi_x$ layer 252a. The second $CuSi_x$ layer 252a prevents diffusion of Cu from the source/drain 260/270 shown in FIG. 3H to the underlying substrate. The plasma treatment 254 is performed in a silane-containing chamber. The temperature of the chamber is substantially in a rang of about 180° C. to about 370° C. The thickness of the second $CuSi_x$ layer 252a is substantially in a rang of about 5 nm to 100 nm.

In FIG. 3G, a subsequent plasma treatment 254a is performed on the second $CuSi_x$ layer 252a in a chamber containing $N_2$ and $NH_3$. The temperature of the chamber is substantially about 180° C. to 370° C. Nitrogen atoms react with the surface of the second $CuSi_x$ layer 252a to form N—Si bond, thereby enhancing the barrier properties of the second $CuSi_x$ layer.

Figure 3H:
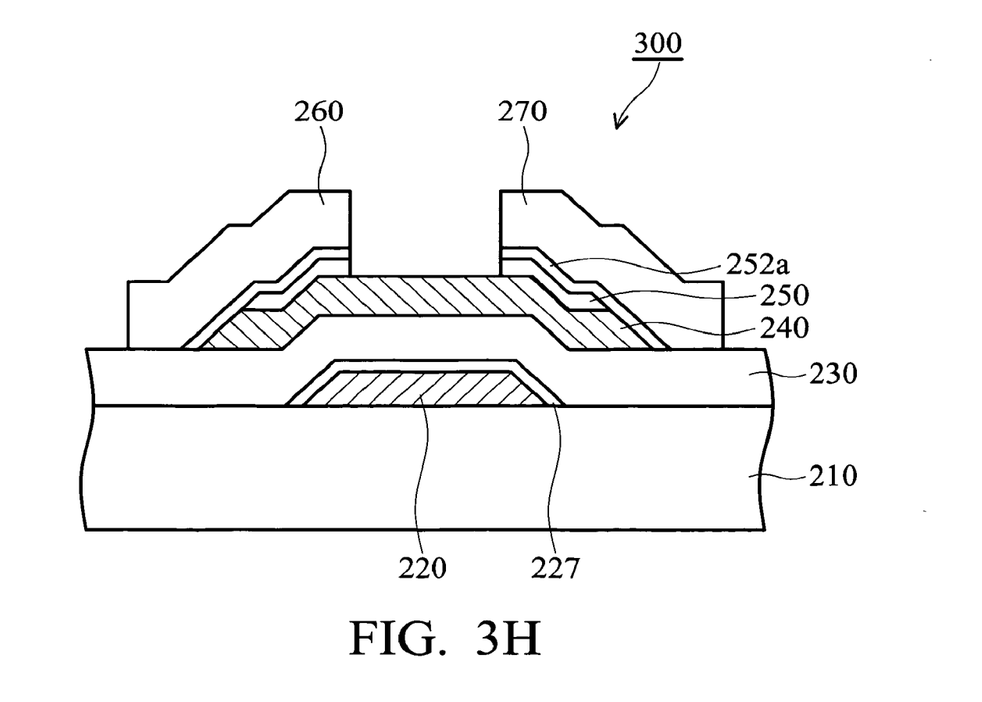

In FIG. 3H, a Cu layer (not shown) is formed on the second $CuSi_x$ layer 252a, for example, by CVD, ECP, or PVD. The source/drain 260/270, of Cu or Cu alloy, is formed on the second $CuSi_x$ layer 252a by selectively etching through the Cu layer, second $CuSi_x$ layer 252a, the ohmic contact layer 250, exposing a portion of the surface of the channel layer 240. A pixel electrode is formed, electrically connecting to the source/drain 260/270. A resultant thin film transistor 300 is obtained.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of fabricating a switching element of a pixel electrode for a display device, comprising:
   forming a gate, comprising Cu or Cu alloy, on a substrate;
   forming a first $CuSi_x$ layer on the gate;
   forming an insulating layer on the first $CuSi_x$ layer;
   forming a semiconductor layer on the insulating layer; and
   forming a source and a drain on the semiconductor layer.

2. The method according to claim 1, further comprising forming a pixel electrode electrically connected to the source or the drain.

3. The method according to claim 1, wherein formation of the first $CuSi_x$ layer on the gate comprises performing plasma treatment on the gate.

4. The method according to claim 3, wherein the plasma treatment is performed in a silane-containing chamber, wherein the temperature of the chamber is substantially in a range of about 180° C. to 370° C.

5. The method according to claim 1, wherein the first $CuSi_x$ layer is conformally formed on the gate.

6. The method according to claim 1, wherein the thickness of the first $CuSi_x$ layer is substantially about 5 nm to 100 nm.

7. The method according to claim 1, further comprising a subsequent treatment for the first $CuSi_x$ layer.

8. The method according to claim 7, wherein the subsequent treatment comprises a plasma treatment performed in a chamber containing $N_2$ and $NH_3$, wherein the temperature of the chamber is substantially about 180° C. to 370° C.

9. The method according to claim 1, wherein the source and the drain comprise Cu or Cu alloy.

10. The method according to claim 9, further comprising forming a second $CuSi_x$ layer between the semiconductor layer and the source/drain.

11. The method according to claim 10, wherein formation of the second $CuSi_x$ layer comprises forming a Cu layer or a Cu alloy layer on the semiconductor layer and performing a plasma treatment on the Cu layer or the Cu alloy layer.

12. The method according to claim 11, wherein the plasma treatment is performed in a silane-containing chamber, wherein the temperature of the chamber is substantially about 180° C. to 370° C.

13. The method according to claim 10, further comprising a subsequent treatment for the second $CuSi_x$ layer.

14. The method according to claim 13, wherein the subsequent treatment comprises a plasma treatment performed in a chamber containing $N_2$ and $NH_3$, wherein the temperature of the chamber is substantially about 180° C. to 370° C.

* * * * *